United States Patent
Shields

(10) Patent No.: US 7,250,823 B2
(45) Date of Patent: Jul. 31, 2007

(54) DIRECT DIGITAL SYNTHESIS (DDS) PHASE LOCKED LOOP (PLL) FREQUENCY SYNTHESIZER AND ASSOCIATED METHODS

(75) Inventor: Nicholas Paul Shields, Fairport, NY (US)

(73) Assignee: Harris Corporation, Melbourne, FL (US)

( * ) Notice: Subject to any disclaimer, the term of this patent is extended or adjusted under 35 U.S.C. 154(b) by 185 days.

(21) Appl. No.: 11/136,968

(22) Filed: May 25, 2005

(65) Prior Publication Data

US 2006/0268182 A1    Nov. 30, 2006

(51) Int. Cl.
*H03L 7/00* (2006.01)
(52) U.S. Cl. .................. 331/16; 331/34; 375/376; 455/260; 332/123; 332/126; 332/127
(58) Field of Classification Search ............... 331/16, 331/34; 375/376; 455/260; 332/123, 167, 332/127
See application file for complete search history.

(56) References Cited

U.S. PATENT DOCUMENTS

| | | | | |
|---|---|---|---|---|
| 5,847,615 A * | 12/1998 | Roth | ............................ | 331/16 |
| 5,986,512 A | 11/1999 | Eriksson | ...................... | 331/16 |
| 6,384,772 B1 * | 5/2002 | Bradley | ....................... | 342/172 |
| 6,441,690 B1 * | 8/2002 | Savelli et al. | ............... | 331/1 A |
| 6,587,511 B2 | 7/2003 | Barak et al. | ................. | 375/295 |
| 2004/0121744 A1 | 6/2004 | Wannenmacher | ............ | 455/118 |

\* cited by examiner

*Primary Examiner*—Arnold Kinkead
(74) *Attorney, Agent, or Firm*—Allen, Dyer, Doppelt, Milbrath & Gilchrist, P.A.

(57) ABSTRACT

The phase locked loop (PLL) frequency synthesizer includes a phase detector receiving a reference signal, a controlled oscillator (e.g. a voltage controlled oscillator) connected to the phase detector and generating a synthesized frequency output signal based upon the reference signal, a mixer (e.g. an in-phase and quadrature-phase (IQ) modulator) connected to the controlled oscillator, a divider connected between the mixer and the phase detector, and a signal source driving the mixer. The frequency synthesizer and method have narrow frequency steps (e.g. as low as fractions of a Hertz) while using a relatively high reference frequency to maintain low phase noise. Furthermore, the fine frequency tuning resolution is achieved while also reducing output spurs and using a relatively simple topology.

26 Claims, 2 Drawing Sheets

DIRECT DIGITAL SYNTHESIS (DDS) PHASE LOCKED LOOP (PLL) FREQUENCY SYNTHESIZER AND ASSOCIATED METHODS

FIELD OF THE INVENTION

The present invention relates to the field of frequency synthesizers, and, more particularly, to frequency synthesizers with narrow frequency steps and related methods.

BACKGROUND OF THE INVENTION

Signal sources, sometimes referred to as frequency sources, are used to generate signals for use in many electronic systems. Applications requiring a source with both high-Q frequency stability/accuracy characteristics and frequency tunability generally require the use of a so-called "locked" signal source. In a locked source, a tunable source is locked to or otherwise derived from a fixed or "reference" source. Often the tunable source is locked to a reference source using one or more feedback circuits or feedback loops. In the case of a locked source using a feedback loop, once the feedback loop is closed the tunable source can achieve frequency stability and accuracy that are a function of the reference source frequency stability. Such a configuration of tunable and fixed sources locked together is known in the art as a synthesized source or simply as a frequency synthesizer.

A frequency synthesizer, then, is a signal source that generates an output signal from one or more reference signals. In general, a frequency synthesizer produces a signal including a single frequency selected from among a finite set of discrete frequencies available based upon the design of the synthesizer. Frequency synthesizers of various forms and designs are useful in a wide variety of applications including FM car radios, radar systems, handheld radios and test equipment, such as spectrum analyzers and signal generators.

In many cases, the synthesized signal produced by a given synthesizer is often at a higher frequency than that of the reference signal(s). The synthesized signal is typically a very stable, spectrally pure, single frequency signal having low or sometimes even very low phase noise. However, unlike other signal sources, such as a free-running voltage controlled oscillator (VCO), a given frequency synthesizer generally is capable of producing only a finite, although often large, number of selectable, discrete frequencies as an output signal. Therefore, frequency synthesizers are most often used where the frequency stability/precision and spectral purity are of paramount importance.

A number of different types of frequency synthesizers or methods of frequency synthesis are known including direct digital synthesis (DDS) and phase locked loop (PLL) frequency synthesis. The DDS uses a digital to analog converter (DAC) to convert a digital data stream into an analog output signal. The digital data stream is a digital representation of a sampled version of the desired output signal, thus the DDS directly synthesizes the output signal. In a PLL synthesizer, a feedback loop is used to compare and "phase lock" the output signal of a tunable frequency source, such as a VCO, to a stable reference signal produced by one or more reference sources. When locked, the PLL output frequency is typically a multiple of the reference signal or linear combination of the reference signal and other signals generated by the synthesizer. There are also hybrid synthesizers that combine one or more of these or other various frequency synthesis approaches.

A basic, single loop PLL synthesizer (SLS) used to synthesize a signal from a stable reference includes a voltage-controlled oscillator (VCO), a frequency divider, a reference oscillator, a phase/frequency comparator or detector (PFD), and a loop filter. The VCO produces an output signal, the frequency of which is proportional to an input control voltage. The frequency divider divides the output signal produced by the VCO to create a lower frequency signal. The frequency divider is a device that accepts a signal at a frequency f and produces an output signal at a frequency f/N where N is the division factor of the frequency divider.

The signal produced by the frequency divider is compared by the PFD to a reference frequency signal produced by the reference oscillator. The PFD, in turn, produces an error signal that is proportional to the phase/frequency difference between the frequency of the output signal of the frequency divider and the reference signal frequency, the error signal provided by the PFD output can take various forms, however commonly the error signal is presented as a "charge pump" configuration, where pulses of current form the error signal. The error signal is then filtered by the loop filter to produce the input control voltage of the VCO, the filtering is needed to remove the PFD comparison frequency and other spurious frequencies that would corrupt the spectral purity of the VCO, in the case of the "charge pump" PFD, the loop filter also integrates the current pulses to provide the DC control voltage that a VCO typically requires.

The action of the feedback loop of the PLL eventually causes or forces the error voltage to equal zero, a situation that is strictly true only when the output from frequency divider has the same phase as the reference signal. In essence, the VCO output signal is automatically adjusted by the feedback loop until the phase of the divided signal produced by the frequency divider equals the phase of the reference signal. Moreover, since the frequency of a signal is the derivative of the phase of the signal, for a pair of signals to have the same phase the signals must also have the same frequency. When the error voltage has been made equal to zero by the action of the feedback loop, the loop is said to be "locked" to the reference source.

Changing either the division factor N of the loop divider or the reference signal frequency can be used to change the frequency of the output signal. Generally but not always, the reference signal is fixed and the loop division factor is changed to affect tuning in a single loop frequency synthesizer (SLS).

Since low phase noise and minimizing spurious frequency content in the output signal are often key performance characteristics of a synthesizer, it is important to consider approaches that reduce or minimize the phase noise and spurious content. A synthesizer, with very high frequency operation and wide tuning range, typically requires special efforts to achieve good phase noise performance. Given that the phase noise "inside the loop bandwidth" (frequencies less than the loop filter frequency cutoff) in the single loop synthesizer is strongly effected by the value of N, one way to improve the phase noise "inside the loop bandwidth" is to reduce the division factor N. This can sometimes be accomplished in a satisfactory manner by increasing the reference signal frequency at the PFD.

However, while it is possible to increase the reference frequency to reduce N, there are limitations to this approach. In particular, unless a fractional-N loop divider (i.e. N not an integer) is used, the reference signal frequency at the PFD entirely determines the spacing between adjacent frequencies that can be synthesized by changing the N divider. The spacing between adjacent frequencies is often referred to as the "step size" or frequency resolution of the synthesizer. For example, if the reference signal frequency at the PFD is 10 MHz and N is an integer, the minimum step size of the synthesizer is 10 MHz. While fractional-N dividers can be used to lessen the step size limitations of using higher reference frequencies, there are additional problems with using fractional-N dividers, specifically the generation of fractional spurs which corrupt the spectral purity of the VCO.

A more commonly used technique to reduce N is to use an offset loop synthesizer. A basic offset loop frequency synthesizer (OLS) uses a low-noise, high frequency offset signal to downconvert or frequency shift the output signal of a main loop to a lower frequency prior to dividing the signal frequency in the main loop divider. The OLS comprises a VCO, an offset mixer, an offset signal source, a loop frequency divider, a PFD, a reference source, and a loop integrator.

The output signal of the VCO at a frequency f is mixed with an offset signal at a frequency fos. Generally, the offset signal frequency fos is chosen to be close to the output signal frequency f. The offset mixer, in turn, ideally produces output signals with the sum and the difference of the two input frequencies. The difference frequency is used to produce an intermediate frequency (IF) signal at a frequency fif. The difference signal is selected by using a lowpass filter and becomes the filtered IF signal. The filtered IF signal is then divided by the loop frequency divider and compared to the reference signal from the reference source by the PFD to produce an error voltage that is integrated by the loop integrator to produce the VCO control voltage. Typically, an output amplifier and a loop amplifier are used in the OLS, as mentioned above for the SLS.

When the loop is locked, the output signal frequency is equal to (fos−N*fref) or (fos+N*Fref), depending the polarity of the loop. Since the IF signal is at a frequency fif that is typically much lower than the VCO output signal frequency f, the division factor N required for a given reference signal frequency fref is typically much smaller than would be required for the SLS described above. Therefore, the phase noise gain associated with the loop division factor N is significantly reduced using an offset loop as in the OLS.

In sampler based synthesizers so-called crossing spurs may be a problem. In a synthesizer in which sampler IF signals cover a wide range of frequencies, nth order mixing products may fall inside the same frequency range as that of the sampler IF signal. These mixing products are generally unwanted and therefore spurious signals. Spurious signals resulting from nth order mixing products tend to move in frequency as the synthesizer is tuned, at a rate that is n times that of the desired, 1st order product. These spurs tend to cross the desired operational band, and are therefore referred to as crossing spurs. Unfortunately, since these nth order mixing products share the frequency range with that of the sampler IF signal, they cannot be filtered out using a filter.

While crossing spurs cannot typically be eliminated, the detrimental effect of crossing spurs can be reduced by decreasing the sampler IF signal frequency range. The narrower the frequency range of the sampler IF signal, the higher will be the order of the spurs that will cross the operational band of the sampler IF signal. Advantageously, the higher the order of a spur, the lower the amplitude of the spur and therefore, the less detrimental it is in terms of synthesizer performance.

Unfortunately, reducing the frequency range of the sampler IF signal for a given synthesizer design requires a larger selection of sample frequencies fs to minimize the sample frequency fs gaps. The frequency range of the sample frequency fs is generally determined by the minimum output frequency and the minimum sample frequency fs used. The maximum frequency gap that the sampler IF signal must cover is determined by the step size of sample frequency fs and the highest harmonic of the sample frequency fs being utilized. So there may be severe practical limitations on how narrow the sampler IF can be made in a given design.

Consequently, there are a number of conflicting requirements for the sampler-based PLL synthesizer. Compromises are often made to balance the requirements of the sample frequency fs and sampler IF signal range. The sampler output or sampler IF signal frequency range may need to be as small as possible to help to reduce the effect of crossing spurs and to simplify the requirements of the tuning reference or interpolation signal of the main loop. However, the frequency range of the sampler IF signal may need to be as large as possible to allow for a coarse stepped sample frequency fs. The coarser the frequency steps, the easier and less expensive it maybe to implement the sampling signal. The sampling signal should have a high frequency sampling signal frequency fs to minimize the harmonic number H. However, a small H requires the sample frequency fs to have a wider frequency range, making low phase noise more difficult to achieve. Moreover, the power level of the signal entering the sampler should be as high as is practical to produce the strongest sampler output signal and maximize the signal-to-noise ratio (SNR) of that signal. Maximizing the sampler output SNR helps to minimize the phase noise of the sampler. On the other hand, the signal level into the sampler should be as low as possible to minimize the generation of higher harmonics and thus to minimize power level of the crossing spurs.

SUMMARY OF THE INVENTION

In view of the foregoing background, it is therefore an object of the present invention to provide a frequency synthesizer and method that have narrow frequency steps (e.g. as low as fractions of a Hertz) while using a relatively high reference frequency to maintain low phase noise inside the loop bandwidth.

This and other objects, features, and advantages in accordance with the present invention are provided by a phase locked loop (PLL) frequency synthesizer including a phase detector receiving a reference signal, a controlled oscillator (e.g. a voltage controlled oscillator) connected to the phase detector and generating a synthesized frequency output signal based upon the reference signal, a mixer comprising an in-phase and quadrature-phase (IQ) modulator connected to the controlled oscillator, a divider connected between the mixer and the phase detector, and a signal source driving the mixer.

An active loop filter may be connected between the phase detector and the controlled oscillator, and an isolation block may be connected between the controlled oscillator and the mixer. The signal source may comprise first and second direct digital synthesizers (DDS) each providing a differential input for the mixer. A reference signal source may generate the reference signal, and a second divider may be connected between the reference signal source and the phase detector. The phase detector, the first divider and the second divider together define a fractional-N synthesizer. A frequency range of the signal source is preferably a fraction of a frequency range of the phase detector.

A method aspect of the invention is directed to generating a frequency synthesized output signal including generating a control signal based upon a reference signal and a feedback signal with a phase detector, generating the frequency synthesized output signal based upon the control signal with a controlled oscillator, generating the feedback signal with a mixer, comprising an IQ modulator, based upon the frequency synthesized output signal, and driving the mixer with a signal source.

The method may also include filtering the control signal with an active loop filter between the phase detector and the controlled oscillator, and isolating the controlled oscillator from the mixer with an isolation block between the controlled oscillator and the mixer. Again, the signal source preferably comprises first and second direct digital synthesizers (DDS) each providing a differential input for the mixer. The reference signal may be provided by a reference signal source, and the method may further include dividing a frequency of the feedback signal with a first divider connected between the mixer and the phase detector, and dividing a frequency of the reference signal with a second divider connected between the reference signal source and the phase detector.

The frequency synthesizer and method have narrow frequency steps (e.g. as low as fractions of a Hertz) while using a relatively high reference frequency to maintain low phase noise. Furthermore, the fine frequency tuning resolution is achieved while also reducing output spurs and using a relatively simple topology.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
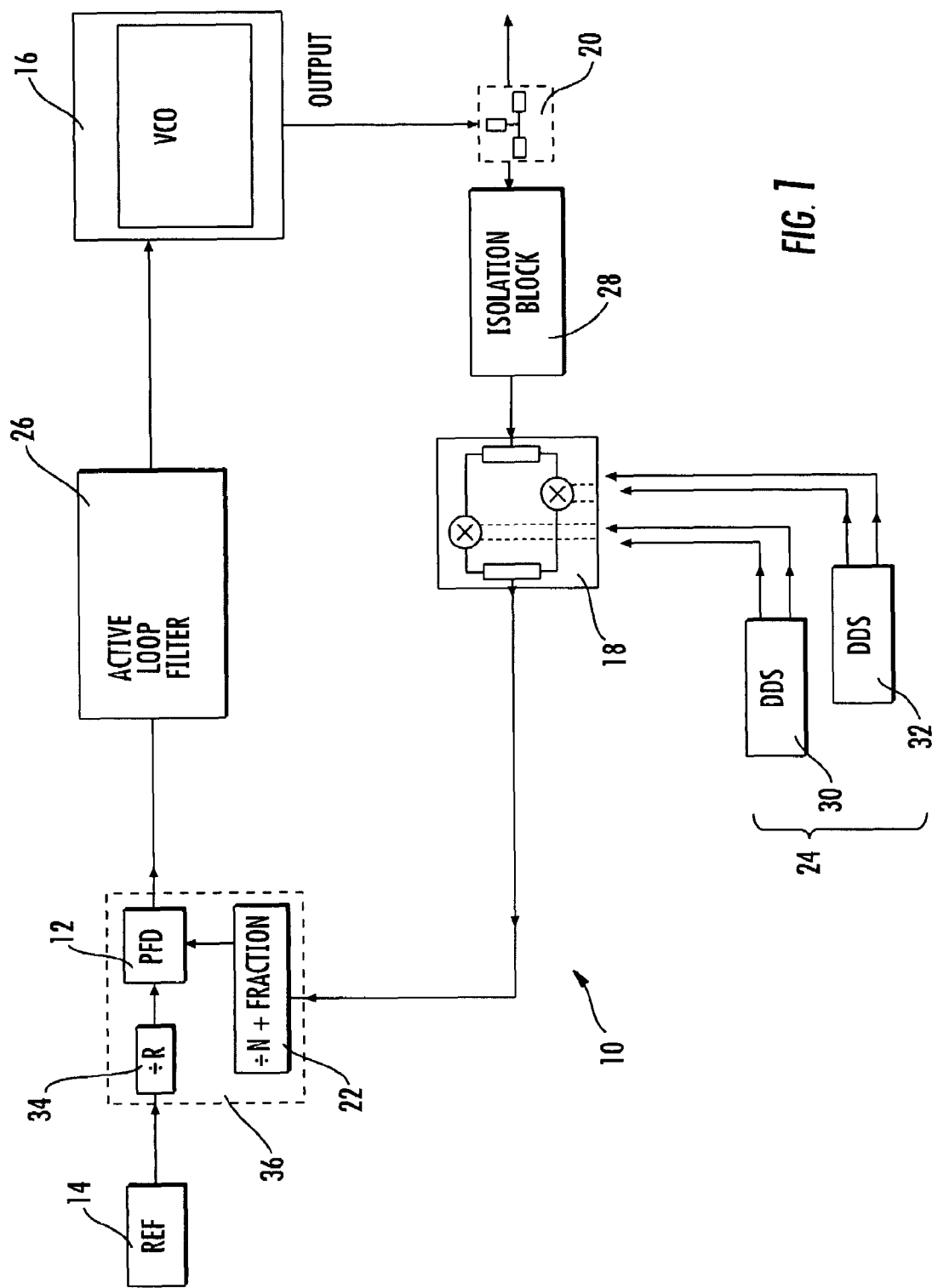
FIG. 1 is a schematic diagram of a phase locked loop (PLL) frequency synthesizer in accordance with the present invention.

Referring initially to FIG. 1, a phase locked loop (PLL) frequency synthesizer 10 of the present invention will be described. The PLL frequency synthesizer 10 includes a phase detector 12, or phase frequency detector (PFD), receiving a reference signal, e.g. from a reference signal source 14. The phase frequency detector 12 detects both phase and frequency differences between the reference input and the feedback signal. A controlled oscillator 16 (e.g. a voltage controlled oscillator) is connected to the phase detector 12 and generates a synthesized frequency output signal based upon the reference signal.

A mixer 18 comprising an in-phase and quadrature-phase (IQ) modulator is connected to the controlled oscillator 16 via a splitter 20 to provide the feedback signal. The IQ modulator is used as a single sideband mixer (SSM) or image reject mixer (IRM). The mixer 18 is driven by a signal source 24 which preferably includes first and second direct digital synthesizers 30, 32 (DDS) each providing a differential input for the mixer 18. Thus, the mixer 18 is quadrature driven. A divider 22 is connected between the mixer 18 and the phase detector 12.

A loop filter 26 (e.g. an active loop filter) is illustratively connected between the phase detector 12 and the controlled oscillator 16. An isolation block 28 is connected between the controlled oscillator 16 and the mixer 18.

Figure 2:
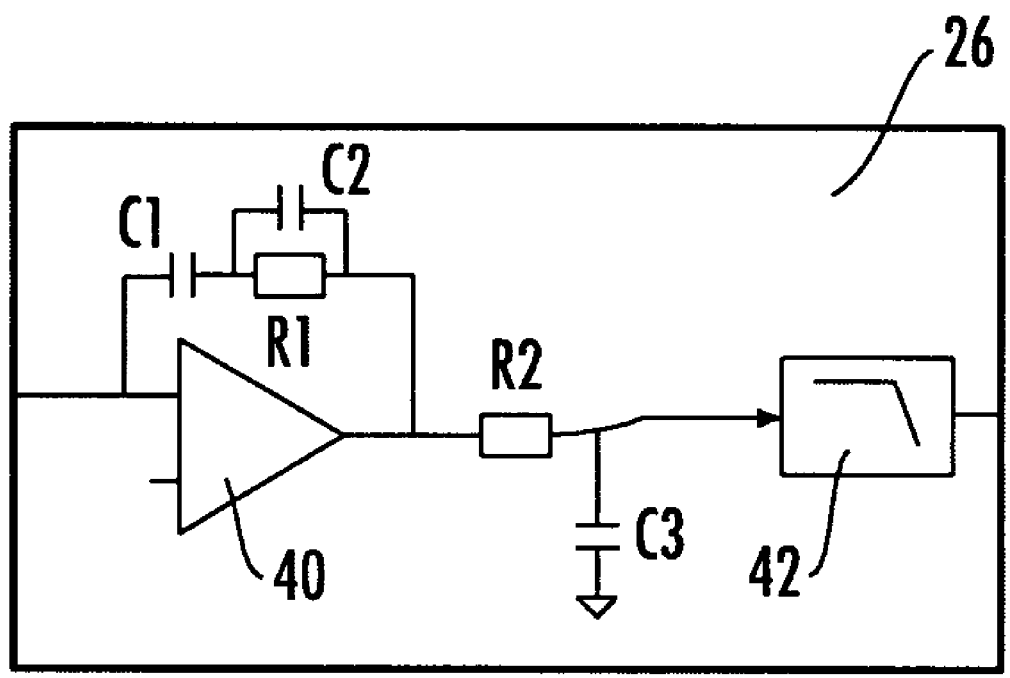
FIG. 2 is a more detailed schematic diagram of the active loop filter in the PLL frequency synthesizer of FIG. 1.
Figure 3:
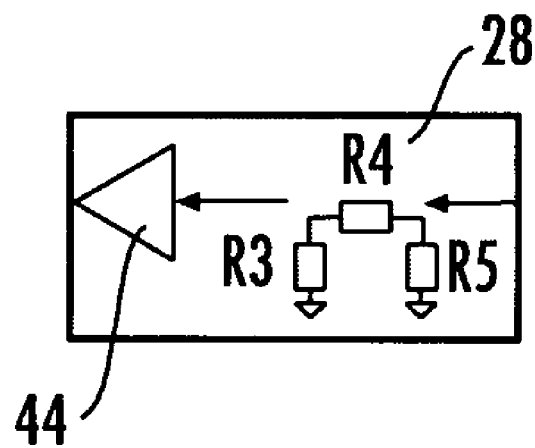
FIG. 3 is a more detailed schematic diagram of the isolation block in the PLL frequency synthesizer of FIG. 1.

Referring to FIG. 2, the loop filter 26, as would be appreciated by those skilled in the art, may include a comparator/amplifier 40, capacitors C1, C2, C3, resistors R1, R2 and low pass filter (LPF) 42 connected as shown. Furthermore, referring to FIG. 3, the isolation block 28 may include the resistors R3-R5, defining an attenuator, and amplifier 44 connected as shown. Such an isolation block 28 reduces and/or eliminates any affects of the feedback signal on the synthesized frequency output signal and the VCO 16.

The reference signal source 14 generates the reference signal, and a second divider 34 may be connected between the reference signal source and the phase detector 12. The phase detector 12, the first divider 22 and the second divider 34 together define a fractional-N synthesizer 36. A frequency range of the signal source 24 is preferably a fraction of a frequency range of the phase detector 12. The fractional-N synthesizer 36 allows the dual DDS source 30, 32 to be used over a narrower frequency range than the phase detector 12, thus reducing and/or eliminating poor spur performance that would otherwise occur as the DDS frequency approached the loop bandwidth or the PFD frequency, and harmonics of the PFD (i.e. crossing spurs as discussed in the background above).

As discussed in the background above, conventional DDS reference synthesizers provide fine frequency tuning resolution at the cost of potentially poor spurious output spurs (DDS spurs are multiplied by 20*log N). This problem increases as N becomes larger.

Also, multi-loop synthesizers provide fine frequency tuning at the cost of complexity in design, and potential problems in reliably locking all synthesizers at start-up. Offset reference synthesizers include difficulties in filtering the image products which can limit wideband applications, corruption of spectral purity due to crossing spurs, and there is a dependency between loop bandwidth and frequency step. A Mixed feedback PLL requires multiple PLLs and multiple VCOs.

However, the frequency synthesizer 10 of the present invention has narrow frequency steps (e.g. as low as fractions of a Hertz) while using a relatively high reference frequency to maintain low phase noise. Furthermore, the fine frequency tuning resolution is achieved while also reducing output spurs and using a relatively simple topology.

A controller and/or software tunes the frequency synthesizer 10 to a particular frequency by using multiple, e.g. three, different variables. For example, if the reference frequency of the reference signal source is 19.2 MHz, a coarse frequency step includes changing the fractional-N synthesizer 36 integer value to provide steps at the phase detector 12 frequency, e.g. 4.8 MHz. An intermediate step includes changing the fractional-N synthesizer 36 fractional register value, e.g. using ¼ fractionality which defines a 1.2 MHz frequency step. Then a fine frequency step down to milliHertz includes using the dual DDS source 30, 32 to "fill in" anywhere within the 1.2 MHz step not covered by the fractionality step. The VCO 16 may operate over a frequency range from 1000-2000 MHz for example, for a low power handheld radio.

A method aspect of the invention is directed to generating a frequency synthesized output signal including generating a control signal based upon a reference signal and a feedback signal with the phase detector 12, generating the frequency synthesized output signal based upon the control signal with the controlled oscillator 16, generating the feedback signal with the mixer 18, comprising an IQ modulator, based upon the frequency synthesized output signal, and driving the mixer with the signal source 24.

The method may also include filtering the control signal with the loop filter 26 between the phase detector 12 and the controlled oscillator 16, and isolating the controlled oscillator from the mixer 18 with an isolation block 28 between the controlled oscillator and the mixer. Again, the signal source 24 preferably comprises first and second direct digital synthesizers (DDS) 30, 32 each providing a differential input for the mixer 18. The reference signal is provided by a reference signal source 14, and the method may further include dividing a frequency of the feedback signal with a first divider 22 connected between the mixer 18 and the phase detector 12, and dividing a frequency of the reference signal with a second divider 34 connected between the reference signal source 14 and the phase detector 12.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A phase locked loop (PLL) frequency synthesizer comprising:
   a phase detector receiving a reference signal;
   a controlled oscillator connected to said phase detector and generating a synthesized frequency output signal based upon the reference signal;
   a mixer comprising an in-phase and quadrature-phase (IQ) modulator connected to the controlled oscillator;
   a divider connected between the mixer and the phase detector; and
   at least one signal source driving the mixer and comprising first and second direct digital synthesizers (DDS) each providing a differential input for the mixer.

2. The frequency synthesizer according to claim 1 further comprising an active loop filter between the phase detector and the controlled oscillator.

3. The frequency synthesizer according to claim 1 further comprising an isolation block between the controlled oscillator and the mixer.

4. The frequency synthesizer according to claim 1 further comprising:
   a reference signal source generating the reference signal; and
   a second divider connected between the reference signal source and the phase detector.

5. The frequency synthesizer according to claim 4 wherein the phase detector, the first divider and the second divider together define a fractional-N synthesizer.

6. The frequency synthesizer according to claim 1 wherein the controlled oscillator comprises a voltage controlled oscillator.

7. The frequency synthesizer according to claim 1 wherein a frequency range of the at least one signal source is a fraction of a frequency range of the phase detector.

8. A frequency synthesizer comprising:
   a fractional-N synthesizer block receiving a reference signal;
   a voltage controlled oscillator connected to the fractional-N synthesizer block and generating a frequency synthesized output signal based upon the reference signal;
   a single-sideband mixer providing a feedback signal to the fractional-N synthesizer block based upon the frequency synthesized output signal; and
   first and second direct digital synthesizers (DDS) each providing a differential input for the single sideband mixer.

9. The frequency synthesizer according to claim 8 wherein the single sideband mixer comprises an IQ modulator.

10. The frequency synthesizer according to claim 8 wherein the fractional-N synthesizer block comprises:
    a first divider receiving the feedback signal from the single sideband mixer;
    a second divider receiving the reference signal; and
    a phase detector connected to the first divider and the second divider.

11. The frequency synthesizer according to claim 8 further comprising an active loop filter connected between the phase detector and the controlled oscillator.

12. The frequency synthesizer according to claim 8 further comprising an isolation block connected between the voltage controlled oscillator and the single sideband mixer.

13. A method for generating a frequency synthesized output signal comprising:
    generating a control signal based upon a reference signal and a feedback signal with a phase detector;
    generating the frequency synthesized output signal based upon the control signal with a controlled oscillator;
    generating the feedback signal with a mixer, comprising an IQ modulator, based upon the frequency synthesized output signal; and
    driving the mixer with at least one signal source comprising first and second direct digital synthesizers (DDS) each providing a differential input for the mixer.

14. The method according to claim 13 further comprising filtering the control signal with an active loop filter between the phase detector and the controlled oscillator.

15. The method according to claim 13 further comprising isolating the controlled oscillator from the mixer with an isolation block between the controlled oscillator and the mixer.

16. The method according to claim 13 wherein the reference signal is provided by a reference signal source; and further comprising dividing a frequency of the feedback signal with a first divider connected between the mixer and the phase detector, and dividing a frequency of the reference signal with a second divider connected between the reference signal source and the phase detector.

17. The method according to claim 16 wherein the phase detector, the first divider and the second divider together define a fractional-N synthesizer.

18. The method according to claim 13 wherein the controlled oscillator comprises a voltage controlled oscillator.

19. The method according to claim 13 wherein a frequency range of the at least one signal source is a fraction of a frequency range of the phase detector.

20. A phase locked loop (PLL) frequency synthesizer comprising:
   a phase detector receiving a reference signal;
   a controlled oscillator connected to said phase detector and generating a synthesized frequency output signal based upon the reference signal;
   a mixer comprising an in-phase and quadrature-phase (IQ) modulator connected to the controlled oscillator;
   a divider connected between the mixer and the phase detector; and
   at least one signal source driving the mixer and having a frequency range being a fraction of a frequency range of the phase detector.

21. The frequency synthesizer according to claim 20 further comprising an active loop filter between the phase detector and the controlled oscillator.

22. The frequency synthesizer according to claim 20 further comprising an isolation block between the controlled oscillator and the mixer.

23. The frequency synthesizer according to claim 20 wherein the controlled oscillator comprises a voltage controlled oscillator.

24. A method for generating a frequency synthesized output signal comprising:
   generating a control signal based upon a reference signal and a feedback signal with a phase detector;
   generating the frequency synthesized output signal based upon the control signal with a controlled oscillator;
   generating the feedback signal with a mixer, comprising an IQ modulator, based upon the frequency synthesized output signal; and
   driving the mixer with a at least one signal source having a frequency range being a fraction of a frequency range of the phase detector.

25. The method according to claim 24 further comprising filtering the control signal with an active loop filter between the phase detector and the controlled oscillator.

26. The method according to claim 24 further comprising isolating the controlled oscillator from the mixer with an isolation block between the controlled oscillator and the mixer.

* * * * *

UNITED STATES PATENT AND TRADEMARK OFFICE
CERTIFICATE OF CORRECTION

PATENT NO. : 7,250,823 B2
APPLICATION NO. : 11/136968
DATED : July 31, 2007
INVENTOR(S) : Shields It is certified that error appears in the above-identified patent and that said Letters Patent is hereby corrected as shown below:

Column 2, Line 22      Delete: "signal,"
                       Insert   -- signal. --

Column 2, Line 32      Delete: "frequency"
                       Insert   -- the frequency --

Column 10, Line 13     Delete: "a"

Signed and Sealed this

Twenty-ninth Day of April, 2008

JON W. DUDAS
*Director of the United States Patent and Trademark Office*